United States Patent
Colello et al.

[11] Patent Number: 6,084,296
[45] Date of Patent: Jul. 4, 2000

[54] LOW COST HIGH POWER HERMETIC PACKAGE WITH ELECTRICAL FEED-THROUGH BUSHINGS

[75] Inventors: Gary M. Colello, Lunenburg; Dennis E. Hartzell, Hudson, both of Mass.

[73] Assignee: Satcon Technology Corporation, Cambridge, Mass.

[21] Appl. No.: 09/112,683

[22] Filed: Jul. 9, 1998

[51] Int. Cl.[7] .................... H01L 23/04; H01L 23/043; H01L 23/34
[52] U.S. Cl. .................... 257/698; 257/687; 257/699; 257/708; 257/723; 257/731
[58] Field of Search .................... 257/687, 699, 257/708, 723, 731, 698

[56] References Cited

U.S. PATENT DOCUMENTS

| | | | |
|---|---|---|---|
| 3,880,493 | 4/1975 | Lockhart, Jr. | 339/147 |
| 4,453,033 | 6/1984 | Duff et al. | 174/52 |
| 4,585,382 | 4/1986 | Bryce, Jr. | 411/34 |
| 5,272,283 | 12/1993 | Kuzma | 174/262 |
| 5,401,536 | 3/1995 | Shores | 427/294 |
| 5,438,223 | 8/1995 | Higashi et al. | 257/774 |
| 5,512,786 | 4/1996 | Imamura et al. | 257/780 |
| 5,523,622 | 6/1996 | Harada et al. | 257/734 |
| 5,569,958 | 10/1996 | Bloom | 257/698 |
| 5,574,313 | 11/1996 | McKleroy | 257/728 |
| 5,578,869 | 11/1996 | Hoffman et al. | 257/691 |
| 5,585,672 | 12/1996 | Koike et al. | 257/707 |
| 5,596,230 | 1/1997 | Hong | 257/758 |
| 5,600,181 | 2/1997 | Scott et al. | 257/723 |
| 5,619,071 | 4/1997 | Myers et al. | 257/753 |
| 5,633,531 | 5/1997 | Hornig et al. | 257/699 |
| 5,640,051 | 6/1997 | Tomura et al. | 257/778 |
| 5,668,064 | 9/1997 | Park et al. | 438/637 |
| 5,682,065 | 10/1997 | Farnworth et al. | 257/727 |

*Primary Examiner*—Mahshid Saadat
*Assistant Examiner*—Matthew E Warren
*Attorney, Agent, or Firm*—Dike, Bronstein, Roberts & Cushman, LLP; George W. Neuner

[57] ABSTRACT

A method for providing pre-placed, pre-brazed feed throughs in the substrate of a hermetic package corresponding to the terminal leads of the encased circuit COTS components. The substrate may include directly bonded copper (DBC) regions forming circular shapes where the holes for the special connectors of the present invention will be located. These holes will correspond to the leads of the COTS component that will be mounted to it. Holes are laser or mechanically drilled into the substrate inside the circular shapes formed in the DBC. To form the feed through, a bushing, such as a blind copper rivet, is brazed in the hole, with the open end thereof oriented toward the component-side of the substrate. These open ends can accept the leads of the COTS component, like the holes of a conventional PC circuit board.

20 Claims, 6 Drawing Sheets

LOW COST HIGH POWER HERMETIC PACKAGE WITH ELECTRICAL FEED-THROUGH BUSHINGS

BACKGROUND OF THE INVENTION

1. Field of the Invention

The present invention relates generally to electronic circuits, and more particularly to the formation of electrical feed-throughs in a hermetic package such that conventional off-the-shelf (COTS) semiconductor components may be used in place of expensive, labor-intensive and less reliable chip-and-wire constructions.

2. Background

Certain military standards, such as MIL-STD-883 and MIL-PRF-38534, the contents of which are incorporated herein by reference, describe the requirements for high reliability hermetically sealed electronics modules which can withstand extraordinary conditions and variations of temperature, G-forces, humidity, etc., without significant instances of failure and consistent operability. The tests are rigorous, and include, inter alia: tests measuring reliability over an extended period of time at maximum operating conditions; measuring the impact of storage in an unloaded electrical condition at an elevated temperature; measuring the mechanical strength of electrical connections; measuring resistance to solvents; etc.

Because these electronics may be exposed to extreme environments, for example high and low temperatures, humidity, and dynamic forces involved in military, industrial and aerospace applications, there is an ongoing need for improvements in reliability. There is further the continuing need for improving the efficiency and economy of manufacturing these modules.

Until now, in order to provide circuits exhibiting extraordinary reliability in such extreme environments, it has been necessary to use hermetic packages based on a ceramic circuit board bearing electronic components in the form of special uncoated or "raw" silicon wafers or chips, to which leads are wire bonded. This manufacturing method is known as "chip-and-wire," and a typical unit can be seen in FIG. 1. Leads have been wire bonded to special feed-throughs or vias which provide a path for power and signals through the hermetic container wall. The circuit board substrate is then encased in a metal or ceramic cover and hermetically sealed, usually in dry nitrogen, to protect the electronics from the deleterious effects of moisture and oxygen. Problems exist in matching the coefficient of thermal expansion of the ceramic to an encasing metal and in stabilizing the ceramic/metal bonds without deleteriously affecting the electronics. It should further be noted that the manufacture of hermetic packages typically employs brazing and welding to ensure the sealing of internal-external feed throughs. The heat required for brazing can damage or destroy conventional circuit boards, soldered connections and circuits.

Protection from extreme ambient conditions is particularly important in marine or aerospace shipboard navigation and weapons guidance systems, where electronic malfunction can mean the failure to meet mission objectives, increased risk to military personnel and civilians, or catastrophic loss of equipment or human life.

Because of the extreme conditions and reliability required by military standards, it has not been possible to utilize COTS components in such modules. COTS electronics packages typically comprise a silicon wafer or chip potted or encased in a plastic composition to seal the wafer to some extent from the environment, with electrical leads extending through the plastic. When it is attempted to utilize such components in extreme conditions without sealing them hermetically, the electronics typically fail, e.g., because oxygen, moisture or other harmful materials diffuse through the plastic, and/or the plastic simply fails under the conditions of use. The potting material used in conventional COTS chips also undesirably "outgasses" volatiles as it ages. It is also difficult to use COTS components inside a hermetic package because it is particularly difficult to provide vias through the substrate, which is typically ceramic, which are aligned with the leads extending from the COTS package.

The advantages to using COTS components would reside in both cost and handling during manufacture. The chip and wire method requires the use of unpotted or raw silicon, which is far more expensive than potted chips because raw silicon must be specially handled by chip manufacturers. The commercial demand for potted chips is far greater than for raw wafers, therefore most manufacturers do not sell raw wafers off the shelf. Rather, when raw wafers are sold, they are specially removed from the manufacturing processes before the plastic packaging step. The wafers are removed from the process under stringent conditions, and maintained in stringent conditions until the final packaging. Thus the use of raw wafers adds significantly to the cost of manufacturing prior art packages. Firstly, the special handling in the factory renders raw wafers more costly. Further, because of their fragility, raw silicon wafers are far more expensive to handle without damaging the chip. All of these aspects contribute to the cost of the final product employing raw wafers.

A recurring problem in the prior art has been how to provide and extract electronic power and signals into and out of the hermetic package without violating the hermetic integrity of the sealed package. The structure which permits electronic exchange into and out of the package is usually called a "feed through" or "via". These terms are used interchangably in this specification.

One type of prior art feed through used in hermetic electronics systems employs a copper sphere placed in a hole drilled in the ceramic substrate. By sandwiching the sphere between two pieces of copper on either side of the substrate and applying pressure, the sphere is compressed into filling the hole in a sealing manner. In a so-called chip-and-wire package, raw silicon chips are then mounted to a substrate, and individual connections wired to these squashed-sphere vias, which may be machine-drilled to provide a soldering/wire bonding locus, to form the circuit. As many as 80 or more such feed throughs may be required for a particular sealed electronic module. This method is labor-intensive, low-yield, and therefore very expensive. In high-power applications, the cost per feed through may approach $10, with the resulting cost of the complete electronics module costing, for example, in the range of $600 to $1600 per unit.

Several other arrangements providing vias in an electronics package are disclosed in the prior art. For example, U.S. Pat. No. 5,640,051 discloses a package on a carrier which has vias terminating in contact electrodes. The via holes accept electrodes on a primary substrate such as to allow contact with electrodes. The primary substrate also comprises vias which terminate on the surface with a pad upon which the electrodes are disposed. This method would not be suited for use with hermetic packages because the vias and connections are for use with conventionally-soldered non-hermetic packages. The substrates are typically ordinary PC board, and are not designed for the extreme environments required for high reliability hermetically sealed packages.

U.S. Pat. No. 5,633,531 discloses the composition of glass beads used for hermetic package feed throughs. This conventional method reflects the current state-of-the-art for hermetic packages, which requires each feed-through terminal to be wire bonded to a chip mounted on the substrate, or to other parts of the circuit. Disadvantageously, the use of COTS components is not possible. Moreover, the state of the art does not allow for the use of pick-and-place robotics for assembly of these hermetic packages, such robots being efficiently used in conventional circuit manufacture.

U.S. Pat. No. 5,600,181 discloses a hermetic package having a sealed connector with leads connecting pads to the board. The leads are sealed in the ceramic. This method, while providing a feed-through sealed into the package, still mandates the use of the chip-and-wire assembly method. As mentioned previously, that method is extremely labor-intensive, requiring manual soldering of the leads to raw chips. Again, neither COTS components nor pick-and-place robots may be used in that method.

In conclusion, none of the prior art discloses a hermetic package which allows low-cost, high-reliability manufacture of a hermetically sealed package conforming to military specifications.

SUMMARY OF THE INVENTION

The present invention overcomes the problems in the prior art methods by providing pre-placed, pre-brazed feed throughs in the substrate corresponding to the terminal leads of encased-circuit COTS components. The use of directly bonded copper (DBC) to form the conductor pattern may then be taken advantage of for isolating the COTS components electrically, providing high thermal conductivity, and efficient manufacture. The result is a dramatic reduction in the cost of materials and manufacture of a hermetically sealed package. For example, the prior art example described below in FIG. 1 using chip-and-wire methods costs approximately $650, whereas the equivalently functioning illustrative embodiment of the invention described below may be sold for $150.

Among the objects of the instant invention is to provide a method to provide a feed through in a package circuit substrate and maintaining a hermetic seal. Further, the instant inventive method allows for brazing or high-temperature operations without destroying the electronics.

The invention preferably employs a ceramic substrate having directly bonded copper (DBC) regions, which are commercially available, and may further include a ceramic or metal cover to form the module casing. Preferred ceramic covers have metallized edges which allow the cover to be soldered to the perimeter of the substrate. The DBC is initially bonded to the ceramic substrate, and may be etched, to form circular shaped pads where the holes for the special connectors of the present invention will be located. These holes will correspond to the leads of the COTS component that will be mounted to it, much like the holes on a conventional PC board.

Accordingly, the instant invention discloses a new way of transferring power and signals into and out of a high-reliability hermetically sealed casing to take advantage of the pre-arranged leads attached to COTS components.

According to another aspect of the invention, holes are laser or mechanically drilled into the substrate within the circular shaped pads formed in the DBC. To form the feed through, a bushing, such as a blind copper rivet, is placed in the hole, with the open end thereof oriented toward the componentside of the substrate. These open ends of the bushings or rivets can accept the leads of the COTS component, like the holes of a conventional PC circuit board. Such an arrangement advantageously allows the use of pick and place robots to automate assembly of the package.

According to still a further aspect of the invention, the bushings can then be brazed to the DBC pads on the ceramic board. Preferably a conductive washer is provided on the component side (the head of the bushing will abut the opposite, external side of the substrate), allowing for easy electrical connection later in the assembly process. This allows high-temperature brazing to take place before the electronics are in place.

According to a still further aspect of the invention, the ceramic substrate with the feed throughs in place can then be screen-printed with solder on the component side, and the COTS electronics placed in situ, with their leads in open ends of the bushings, typically by pick-and-place robots.

According to a still further aspect of the invention, the entire assembly (without the cover) is lightly heated to melt the solder, and to solder the COTS components into place. The assembly, with the cover, may next be vacuum-baked to drive off any outgassed oxygen, moisture or volatiles, and is then preferably passed to a dry nitrogen bath at ambient pressure and temperature. The cover may be placed over the substrate and soldered into place to hermetically seal the assembly.

What results is a hermetically sealed module, with the heads of the blind copper rivets on the bottom of the module forming contacts with the electronics within the module. A connector of any variety may then be soldered onto the bottom of the package, or on a supporting structure.

BRIEF DESCRIPTION OF THE DRAWINGS

The foregoing and other features and advantages of the present invention will be more fully understood from the following detailed description of an illustrative embodiment, taken in conjunction with the accompanying drawing in which.

DETAILED DESCRIPTION OF AN ILLUSTRATIVE EMBODIMENT

The present invention will be described herein with reference to an illustrative embodiment of a hermetic package with electrical feed-through bushings.

As described herein, "bushing" is used to describe an article having a usually cylindrical shank for lining a hole in a circuit board substrate. As used herein, a bushing has a shank which may be solid or hollow, and may comprise a flange for limiting the shank penetration into a substrate hole. As further used herein, the term "bushing" will be understood to include articles such as rivets, blind rivets, or any other pin or bolt either headed or otherwise.

As described herein, the term "high-reliability" shall mean electronics complying with, at a minimum, the various applicable testing requirements of MIL-STD-883 and MIL-PRF-38534. Preferably, electronics in accordance with this invention have the ability to withstand steady state life tests for at least about 500 hours, more preferably at least about 1000 hours at its rated operating temperature, preferably at least 125° C.; the ability to withstand stabilization baking at a minimum of 150° C. for 24 hours; the ability to withstand immersion in flux for at least 5 seconds followed by exposure to a temperature of 215° C. for at least 60 seconds; and the ability to be subjected to specified solvent spray or immersion, according to the intended use of the package. The electronics in accordance with this invention also preferably have the ability to withstand specified levels of bond pull forces, and at least about 30,000 g's of constant acceleration.

Further, the term "hermetically" shall be understood to mean at least such airtightness and imperviousness to external influence as required by MIL-STD-883 and MIL-PRF-38534.

Figure 1:
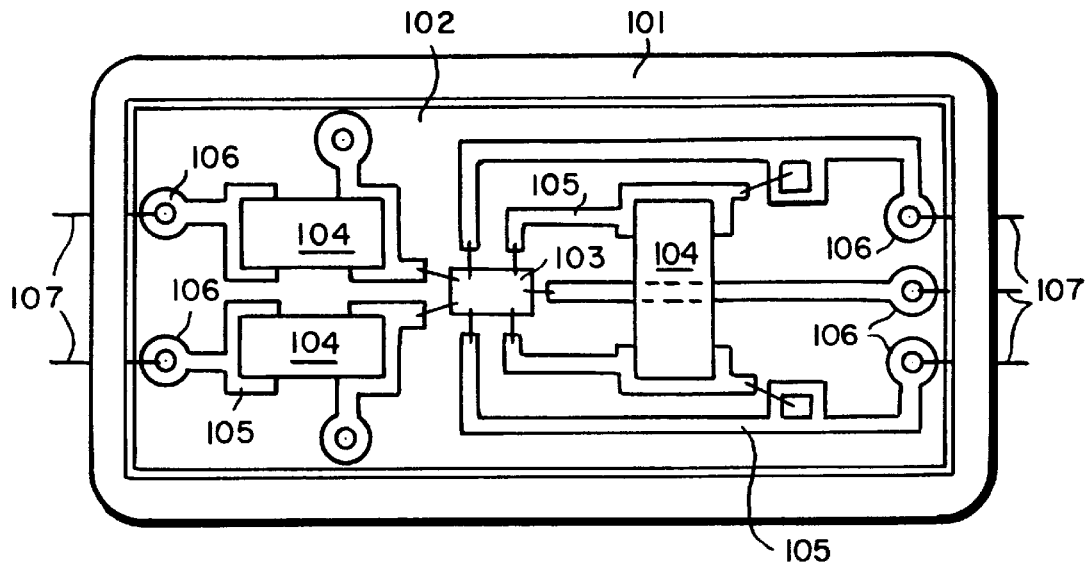
FIG. 1 is a perspective view of a prior art package without a cover before hermetically sealing, and the circuitry thereof.

FIG. 1 depicts a conventional chip-and-wire package as described above. A metal housing 101 is fitted with a ceramic substrate 102 on which is arranged a semiconductor chip 103 and other electronic elements 104. Semiconductor chip 103 is typically hand-mounted and wire bonded to the circuit traces 105. Circuit traces 105 are printed on the substrate 102 and terminate in end points 106. Electrical conductors 107 are wire bonded to the end points 106 and passed into feed throughs, e.g., glass beads, which hermetically seal the connection.

Figure 2:
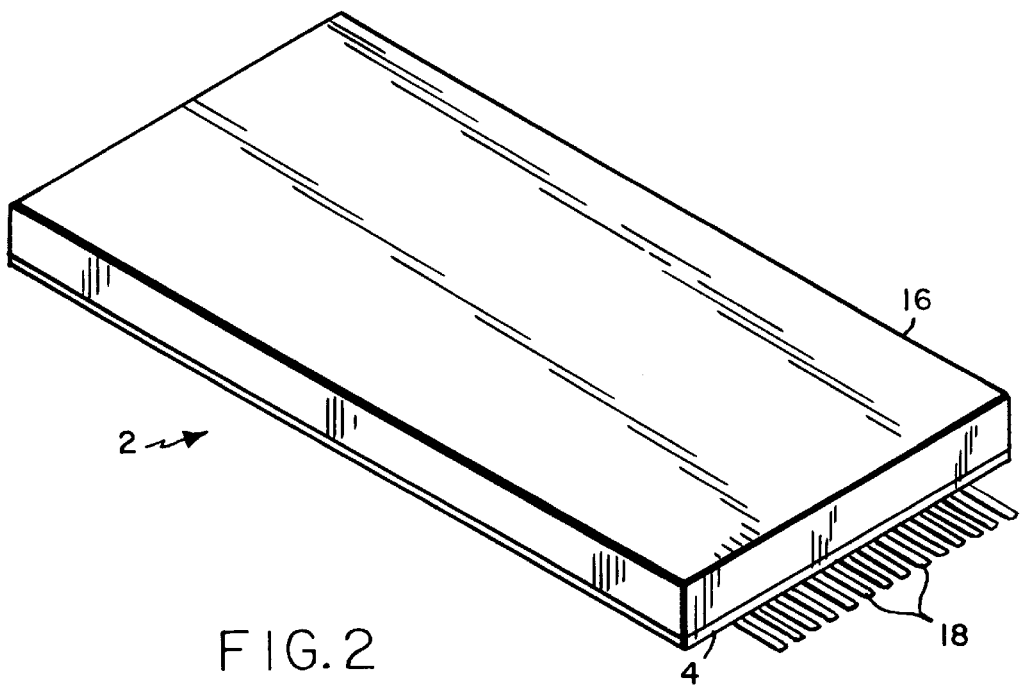
FIG. 2 is a perspective view of a hermetic package according to one embodiment of the invention.

As depicted in FIG. 2, an illustrative embodiment of a hermetic package 2 when assembled resembles a flat box having a substrate 4, which, for example, may be formed of aluminum nitride or alumina, and a cover 16, which, for example, may be formed of ceramic or metal. The cover 16 is sealingly attached to the substrate as further discussed hereinbelow. Connector pins 18 may extend from an end of the package 2 for plugging into a mating connector, for example. Other methods of connecting can also be used.

Figure 3:
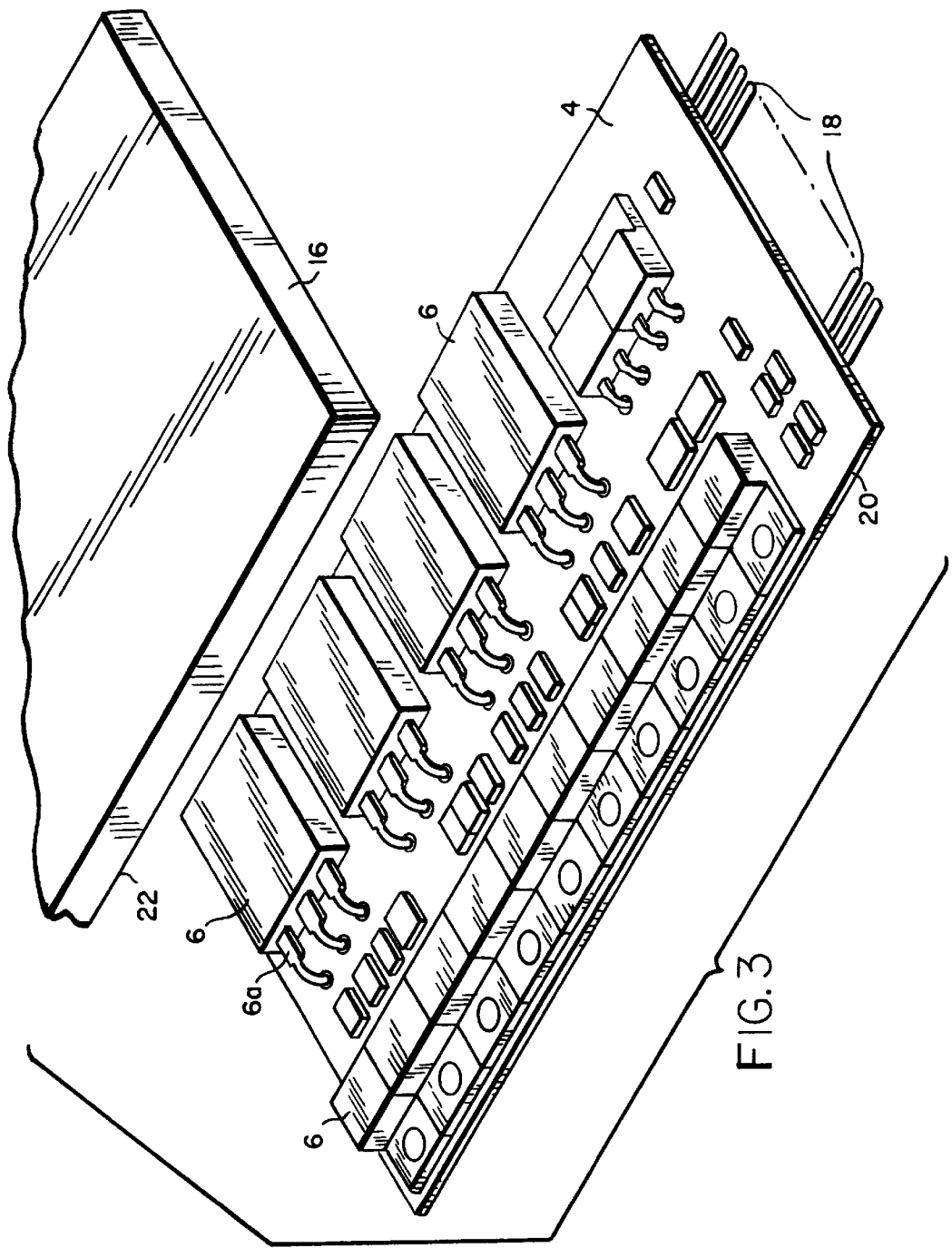
FIG. 3 is a partially exploded perspective view of a hermetic package according to one aspect of the invention.

FIG. 3 depicts the hermetic package of the illustrative embodiment with the cover 16 removed. As illustrated the substrate 4 may carry thereon a plurality of COTS components 6, which in an illustrative embodiment may comprise, for instance, TO-220 diode packages and TO-247 FET packages, available commercially from electronic component manufacturers such as Motorola. To allow the sealing engagement of the cover 16 to the substrate 4, the cover may be provided with an edge 22, which may be metallized in the case of a ceramic cover, located so as to contact the metallized edge 20 of the substrate when the cover is placed in sealing cooperation with the substrate as shown in FIG. 2. The substrate edge 20 preferably comprises a layer of directly bonded copper (DBC) on the substrate, such that the cover 16 may be hermetically bonded to the substrate 4 by, for example, soldering the cover edge 22 to the metallized substrate edge 20.

Figure 4:
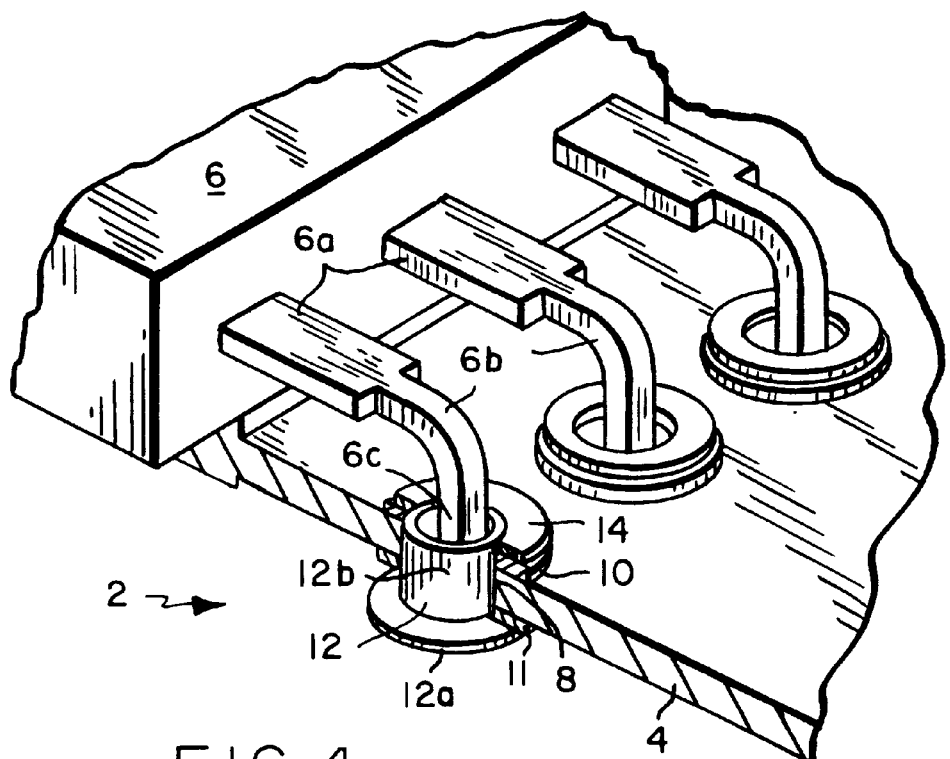
FIG. 4 is a perspective view of a feed through for a hermetic package according to another aspect of the invention.
Figure 4A:
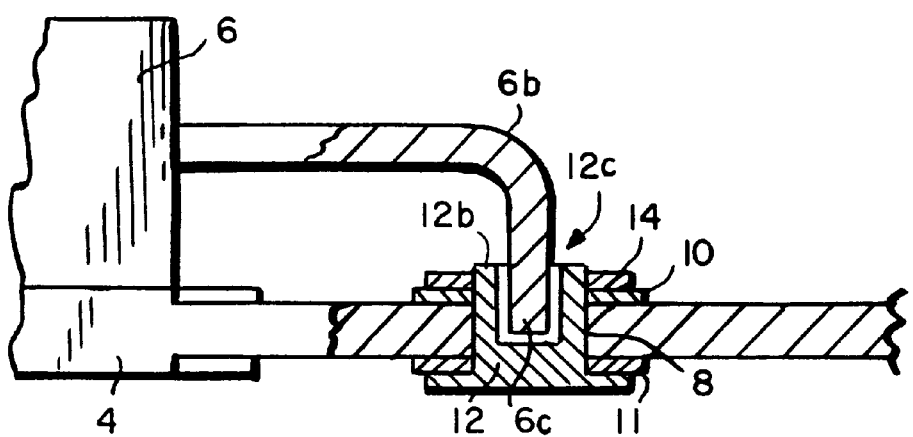
FIG. 4A is a plan view in cross section of the hermetic package according to another aspect of the invention.

FIGS. 4 and 4a depict a close up view and a cross sectional view, respectively, of an illustrative embodiment of a low cost high power feed through bushing according to the instant invention. As shown, the substrate 4 carries thereon a COTS component 6. The component 6 has a typically preformed terminal 6a having an end 6c and a bend 6b intermediate the body of the component 6 and the terminal end 6c.

The substrate 4 is formed with directly bonded copper (DBC) regions on both the component side and the opposite, external side; in other words the two major surfaces of substrate. The DBC may be formed during fabrication of the substrate to comprise regions formed in the shape of a hollow circle 10. Alternatively, these shapes may be etched into a DBC region or otherwise formed. After the DBC process, the substrate may be further processed to locate holes 8 inside the hollow circles 10, which remain to form a circular border about the holes on both major surfaces of the substrate 4 as seen in FIG. 4. Bushing 12, may advantageously include a shank 12b having an outside diameter approximating the diameter of the hole 8, such that the bushing may be received therein as shown in the Figures. The bushing preferably includes a head portion 12a which may be placed in abutting contact with the DBC hollow circle 11, as depicted in the Figures. During fabrication, the bushings 12 are placed in the holes 8 in the substrate 4 with their heads 12a abutting the hollow circles 10 on the bottom major surface of the substrate 4 and are brazed in place. The preferred bushing is a copper blind rivet.

In the illustrative embodiment, the bushing 12 is a conventional blind copper rivet. Of course, other materials may be used. For example, the bushing might be formed of any conductive metal, for example, titanium, molybdenum, or alloys. The bushing may also be plated with another material, for example gold, to enhance solderability or brazability, or to enhance oxidation resistance. The bushing may also be constructed of a non-conductive material plated with a conductive material.

A washer 14 may also be advantageously provided on the component side of the substrate around the shank 12b of the bushing 12 and brazed to the DBC hollow circle 10 on the component side of the substrate 4. Such a washer may help to contain expansion of the bushing along the longitudinal axis of the shank 12b.

All of the materials used in the package are selected so as to have desirable heat-dissipation and thermal-expansion properties. As the package is heated to its limits of operability, which may be over 150° F., it is important that heat may be efficiently removed from the package. It is also important that expansion of any of the parts does not cause a breach in the hermetic quality of the package or a break in electrical conductivity in any part of the package.

With the bushings brazed or otherwise secured into place, the next step in fabrication is the placement of the electronics COTS components. As shown in the FIG. 4a, the ends 6c of the terminals 6a are received within an opening 12c of the shank 12b of bushing 12. The holes 8 are placed in predetermined locations on the substrate so as to locate the openings 12c to receive the terminal ends 6c of the COTS components 6. The method of fabrication will be discussed in greater detail hereinbelow.

Figure 5:
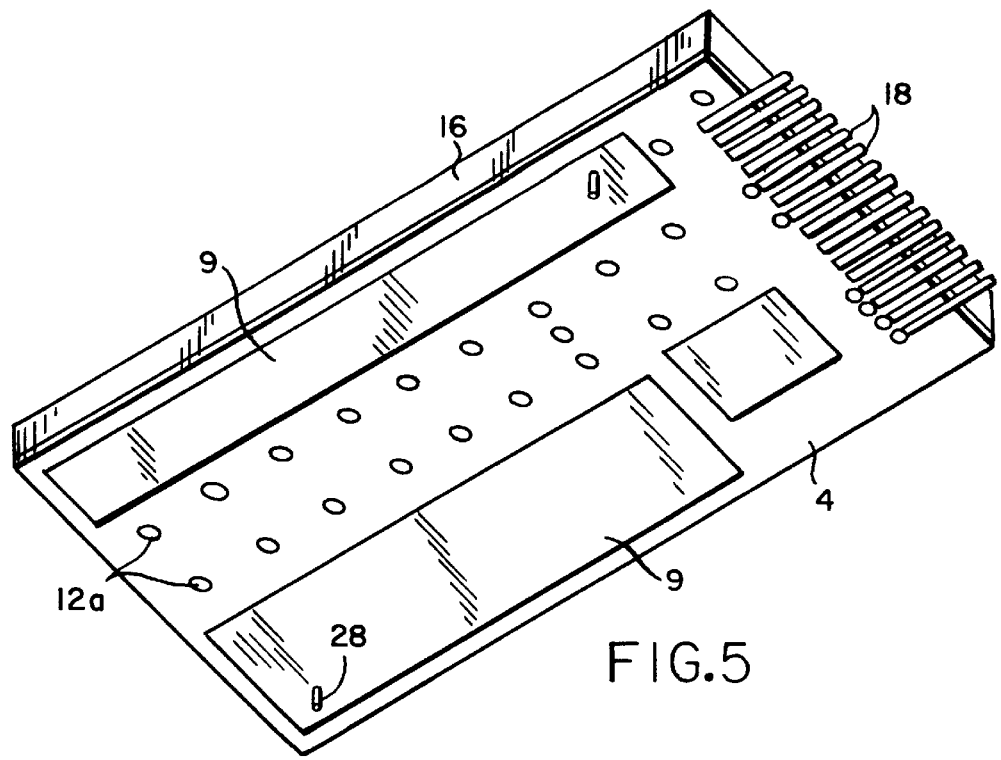
FIG. 5 is a perspective view of the bottom of a hermetic package according to still another aspect of the invention.

Turning to FIG. 5, the bottom is depicted of an illustrative embodiment of a hermetic package 2 embodying the instant invention. As shown, the head portions 12a of the bushings 12 extend below the substrate 4. Also seen in FIG. 5 are DBC thermal interfaces 9, which allow for heat generated by the COTS components to pass through the substrate to a heat sink, as will be discussed in greater detail hereinafter. Also seen are DBC contact fingers 9b which may serve as a convenient location for the soldering or brazing of connecting pins 18 forming a connector for receipt in a mating socket. Pre-manufactured connectors, surface mount connectors, shrouds, or other unitary or separate connector structures may also be used, and may be attached to the substrate by any means well known in the prior art. For example, a secondary mounting might be attached or compression mounted to the package to support a connector so that mechanical stresses are not borne by the substrate.

Exemplary alignment pins 28 are depicted as extending from the substrate 4, for use in mating the package 2 to a mounting structure, such as a heat sink. Of course, other alignment arrangements known in the prior art may be employed.

Figure 6:
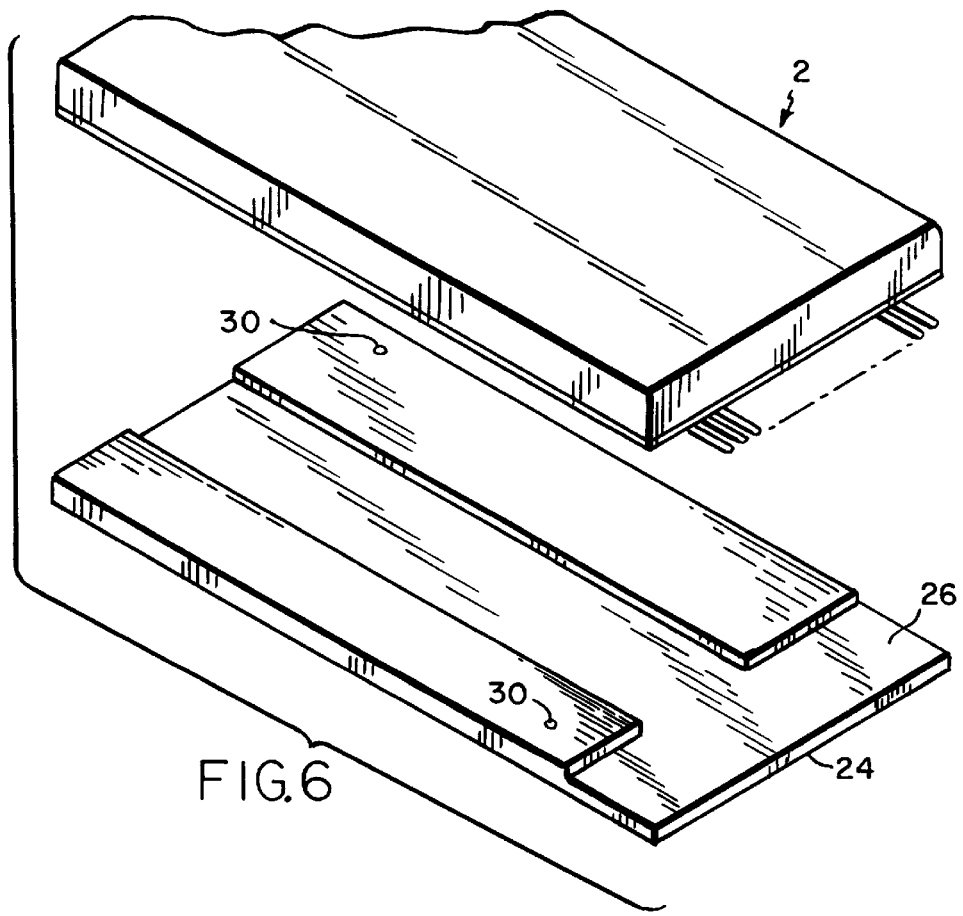
FIG. 6 is a perspective view of a hermetic package according to the invention along with a heat sink.

FIG. 6 depicts a hermetic package 2 embodying the instant invention poised for mounting on a heat sink 24. Heat sink 24 would be defined by the design of the system into which the hermetic package is to be incorporated. In this example, the heat sink 24 has a relief cut portion 26 to accommodate the bushing heads 12a which extend slightly from the substrate 4, and for the connector pins 18. The elevated, non-relieved portions of the heat sink are advantageously arranged to contact the DBC thermal interfaces 9, as depicted in FIG. 5. Such contact between the thermal interfaces 9 and the heat sink provides for an efficient means for removing heat generated by the active electronics, such as the COTS components 6, in the hermetic package. Typically, the prior art has relied on mounting the substrate to a secondary thermal mounting, which is then mounted to heat sink elements in the system into which the hermetic package is incorporated. By the present invention, a secondary mounting or other interposing structure is not necessary, which eliminates the thermal interface boundaries between the substrate and the system heat sink 24. Eliminating thermal interface boundaries increases cooling efficiency.

In foreseen embodiments, the hermetic package can be compression mounted to the system heat sink by a thermally conductive gasketing compound. Some systems, however, might benefit from the interposition of a secondary member, such as a conventional metal-fin style heat dissipater, to which the package might be directly soldered or brazed. The hermetic package of the invention, because of the excellent heat conduction of DBC, allows flexible adaptation to various applications while maintaining superior cooling properties of the electronics mounted in the package.

In use, several hermetic packages may be soldered or mounted on a single plate, for subsequent mounting onto the system heat sink 24. In this instance, it is usually desirable to match as closely as possible the coefficient of thermal expansion (CTE) of the plate to that of the substrate of the package to reduce stresses over thermal cycles.

Figure 7:
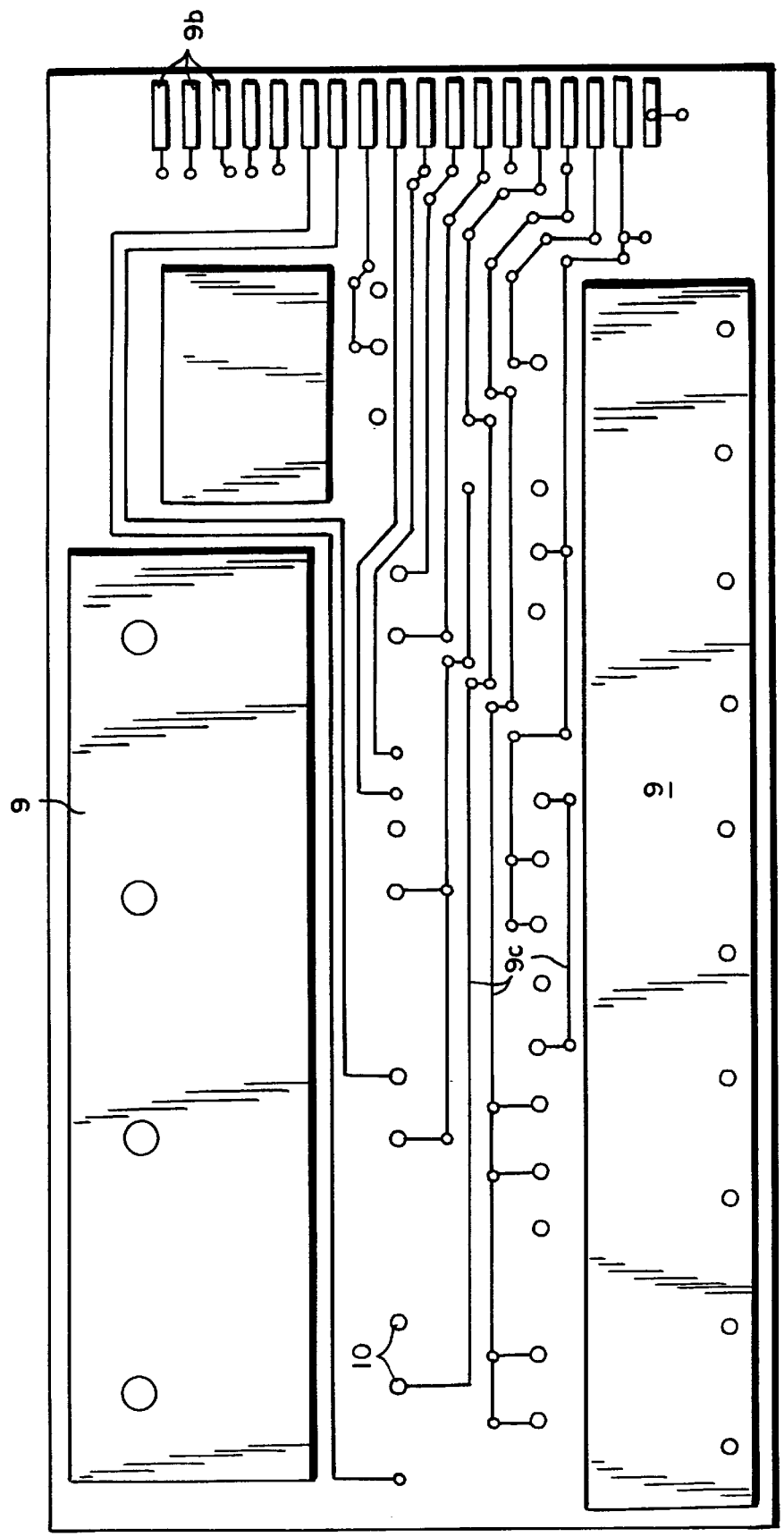
FIG. 7 is a plan view of the bottom side of a substrate of a hermetic package according to still another aspect of the invention.
Figure 8:
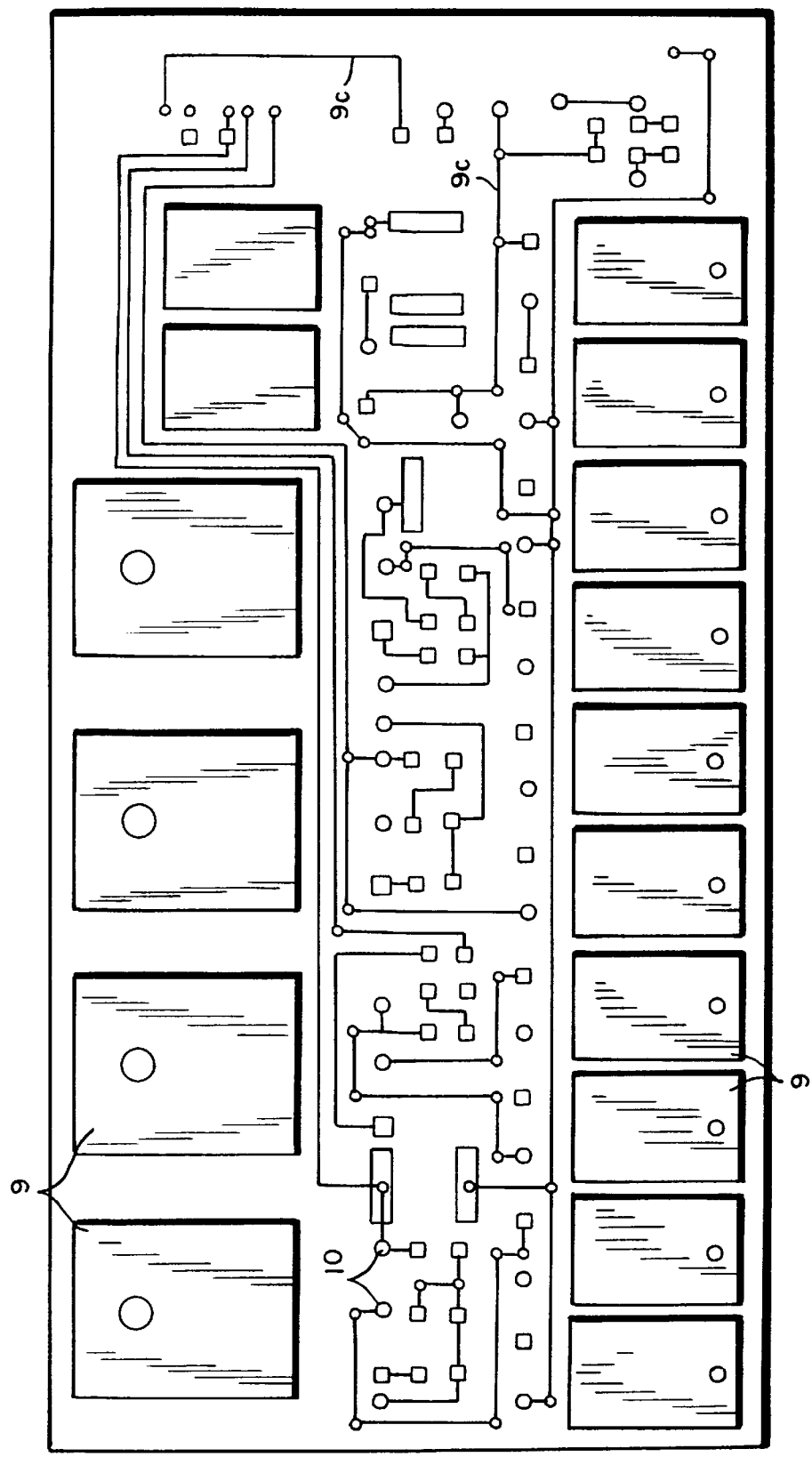
FIG. 8 is a plan view of the component side of a substrate of a hermetic package according to still another aspect of the invention.

FIG. 7 and FIG. 8 depict the DBC patterns on the bottom side and component side of the substrate, respectively, of an illustrative embodiment of a hermetic package embodying the instant invention. The DBC may be directly deposited in the patterns shown in these figures, or alternatively both major surfaces of the substrate may be covered entirely with DBC and the blank portions etched away or removed by other processes known in the art. As shown, the DBC pattern on the finished substrate board may include any of the following: thermal interfaces or heat sink regions 9, circular pads 10 and 11 for surrounding the bushings 12; contact fingers 9b for receiving connector pins 18; and/or circuit traces 9c. It is foreseen that the circular pads 10 and 11 may be formed as solid circles, with the holes 8 being formed in the center region of a solid circle resulting in the same circular border surrounding the hole 8 as depicted in FIG. 4.

The process for manufacturing the low cost, high power hermetic package with electrical feed through bushings of the instant invention will now be described.

First, a substrate, which may be made of alumina, is provided. Predefined regions of directly bonded copper are deposited on the substrate. These regions, as set forth above, may include any of the following: thermal interfaces 9, hollow circles 10 and 11 for surrounding the bushings 12; contact fingers 9b for receiving connector pins 18; and/or circuit traces 9c. Alternatively, both the entire major surfaces may be deposited with DBC and the blank regions etched away or otherwise removed as well known in the prior art. The circular pads 10 and 11 may be correspondingly located on both major surfaces of the substrate 4 in accordance with the predetermined locations for feed throughs (these positions correspond with the centers of circular pads 10 and 11, although it is foreseen that the circular pads 10 and 11 may be formed as solid circles, with the holes being formed in the center region of a solid circle). Using conventional techniques, such as mechanical or laser drilling, or chemical dissolution, holes 8 are formed in the substrate 4 which result n hollow circles 10 forming a circular border around the edges of the holes 8. Such hole drilling may be efficiently accomplished through use of automated machine tools, such as numerical-control or robotic drills.

Bushings 12 are then placed inside the holes 8 with their head portions 12a abutting against the circular pad 11 on the bottom surface of the substrate 4. Such placement may be affected through the use of specially modified pick-and-place robots. The bushings 12 are then brazed into place. A washer 14 may optionally be placed on the substrate side of the bushing shank 12b so as to abut the hollow circle 10 on the component side of the substrate, and similarly brazed into place. The result is a hermetically sealed feed through. The bushing 12, as mentioned hereinabove, may preferably comprise a conventional copper blind rivet.

The component side of the substrate and the fingers 9b are preferably screen printed with solder, and the COTS components 6 and the connector pins 18 are placed on the substrate. The placement of these components may be by commercially-available programmable pick-and-place robots. The entire assembly may then be lightly heated so as to draw the solder into place and secure the components and their electrical connections. In high current applications the connector pins 18 may be spade-type or large-pin type connectors which bridge parallel fingers, or the fingers themselves may be of differing configurations than those depicted, depending on the application.

Next, the entire assembly is baked in a high vacuum chamber to draw out any moisture, oxygen, or other gaseous component that may be trapped in the plastic of the COTS components' plastic potting material or in the substrate. This process is consistent with MIL-STD-883. The entrained contaminants are drawn out over a period of two to twenty four hours, at a typical temperature of 150° C. under high vacuum. After this sufficient time, the substrate and cover are passed through to a dry nitrogen bath, which is typically at ambient pressure and temperature, either before or after cooling. Once the assembly and cover are cooled, the cover 16 hermetically soldered into place, resulting in dry nitrogen being sealed inside the package. The package is at this point ready for shipment.

Although the invention has been shown and described with respect to exemplary embodiments thereof, various other changes, additions and omissions in the form and detail thereof may be made therein without departing from the spirit and scope of the invention.

What is claimed is:

1. An electronics package comprising:
   a substrate having a first side and a second side, the substrate having holes passing between the sides;
   electrically conductive regions contacting the substrate on at least the first side thereof;
   at least one electronics component mounted to the substrate on the second side;
   at least one feed through formed of a bushing, the bushing having a flange hermetically sealingly abutting the electrically conductive region on the first side of the substrate, and a shank located inside one of the holes; wherein
   the electronics component has at least one lead, and wherein the feed through is positioned in the substrate so as to contactingly engage the at least one lead.

2. The electronics package of claim 1, wherein the electronics component further comprises a semiconductor chip.

3. The electronics package of claim 1, further comprising a cover sealingly mounted to the substrate so as to hermetically seal the second side of the substrate from the ambient, the cover and substrate defining a volume.

4. The electronics package of claim 3, wherein the volume is filled with dry nitrogen.

5. The electronics package of claim 1, wherein the conducting regions of the substrate are formed at least in part of directly bonded copper.

6. The electronics package of claim 5, wherein the conducting regions comprise circuit traces.

7. The electronics package of claim 6, wherein there are a plurality of feed throughs and the circuit traces form an electrical circuit with at least some of the plurality of feed throughs.

8. The electronics package of claim 2, wherein the conducting regions of the substrate are formed at least in part of directly bonded copper.

9. The electronics package of claim 8, wherein the conducting regions are circuit traces.

10. The electronics package of claim 9, wherein there are a plurality of feed throughs and the circuit traces form an electrical circuit with at least some of the plurality of feed throughs.

11. The electronics package of claim 1, further comprising thermally conducting regions contacting the substrate on at least the second side thereof.

12. The electronics package of claim 7, wherein the thermally conducting regions of the substrate are formed at least in part of directly bonded copper.

13. The electronics package of claim 1, wherein the conducting regions are contacting the substrate on both sides thereof.

14. The electronics package of claim 13, wherein the shank extends above the surface of the second side of the substrate, and wherein the feed through further comprises a washer surrounding the shank and sealingly abutting the conducting region on the second side of the substrate.

15. A feed through for a hole in a substrate of an electronics package having electronics components, the feed through comprising:
    a substrate having a first side and a second side and having a hole formed therethrough;
    a bushing, the bushing having a flange hermetically sealingly abutting a conducting region on a first side of the substrate, and a shank located inside the hole;
    the shank being electrically connected to an electronics component on the second side of the substrate.

16. The feed through of claim 15, wherein the shank is adapted to extend above a surface of an opposite side of the substrate, and wherein the feed through further comprises a washer surrounding the shank and sealingly abutting a conducting region on the opposite side of the substrate.

17. The feed through of claim 15, wherein the shank further comprises an opening adapted to receive a lead of a semiconductor package.

18. The feed through of claim 17, wherein the bushing is a blind rivet.

19. A hermetically sealed electronics package comprising:
    a substrate having a first side and a second component side;
    electrically conductive regions contacting the substrate on at least one side thereof;
    at least one electronics component mounted to the substrate on the second side;
    at least one an electronics component mounted to the substrate on the second side;
    at least one feed through formed of a bushing, the bushing having a flange hermetically sealingly abutting the electrically conductive region on the first side of the substrate, and a shank located inside one of the holes wherein the electronics component has at least one lead, and wherein the feed through is positioned in the substrate so as to contactingly engage the at least one lead;
    a cover bonded to the substrate to hermetically seal the second component side of the substrate and the at least one electronics component mounted thereon from ambient conditions;
    a heat sink region of directly bonded copper on the first side of the substrate substantially underneath the at least one electronics component.

20. The hermetically sealed electronics package of claim 19 further comprising means for mounting the electronics package to an external heat sink such that the heat sink region of directly bonded copper is in thermal communication with the external heat sink.

* * * * *